(12) United States Patent
Hunter

(10) Patent No.: US 7,434,485 B2
(45) Date of Patent: *Oct. 14, 2008

(54) SENSOR DEVICE FOR NON-INTRUSIVE DIAGNOSIS OF A SEMICONDUCTOR PROCESSING SYSTEM

(75) Inventor: Reginald Hunter, Round Rock, TX (US)

(73) Assignee: Applied Materials, Inc., Santa Clara, CA (US)

( * ) Notice: Subject to any disclaimer, the term of this patent is extended or adjusted under 35 U.S.C. 154(b) by 122 days.

This patent is subject to a terminal disclaimer.

(21) Appl. No.: 11/427,376

(22) Filed: Jun. 29, 2006

(65) Prior Publication Data

US 2006/0236793 A1    Oct. 26, 2006

Related U.S. Application Data

(60) Continuation of application No. 11/052,161, filed on Feb. 7, 2005, which is a continuation of application No. 10/445,598, filed on May 27, 2003, now Pat. No. 6,895,831, which is a continuation of application No. 10/083,899, filed on Feb. 27, 2002, now Pat. No. 6,677, 166, and a continuation of application No. 10/084,290, filed on Feb. 27, 2002, now Pat. No. 6,642,853, which is a division of application No. 09/816,806, filed on Mar. 23, 2001, now Pat. No. 6,468,816, which is a division of application No. 09/036,247, filed on Mar. 6, 1998, now Pat. No. 6,244,121.

(51) Int. Cl.
*G01M 19/00* (2006.01)

(52) U.S. Cl. .................................... 73/865.9

(58) Field of Classification Search ........ 73/865.8–866, 73/866.5; 324/765; 29/593; 438/5, 8, 10–11, 438/16–18
See application file for complete search history.

(56) References Cited

U.S. PATENT DOCUMENTS 4,119,381 A    10/1978    Muka et al.
4,180,199 A    12/1979    O'Rourke et al.

(Continued)

FOREIGN PATENT DOCUMENTS

DE        3412724        10/1985

(Continued)

OTHER PUBLICATIONS

IBM Technical Disclosure Bulletin Acc No. NA63061285 vol. 26, No. 3A, pp. 1286-1287 "Eddy Current-Inducted Stray Magnetic-Field Cancellation Technique for 8-H Loop Application", Aug. 1983.

(Continued)

*Primary Examiner*—Thomas P Noland
(74) *Attorney, Agent, or Firm*—Patterson & Sheridan

(57) ABSTRACT

A battery powered sensing device for diagnosing a processing system and method for using the same are provided. The support platform generally has physical characteristics, such as size, profile height, mass, flexibility and/or strength, substantially similar to those of the substrates that are to be processed in the processing system, so the sensor device can be transferred through the processing system in a manner similar to the manner in which production substrates are transferred through the processing system.

22 Claims, 8 Drawing Sheets

U.S. PATENT DOCUMENTS

| | | | |
|---|---|---|---|
| 4,365,705 A | 12/1982 | Zinck et al. | |
| 4,543,576 A | 9/1985 | Hieber et al. | |
| 4,745,564 A | 5/1988 | Tennes et al. | |
| 4,819,167 A | 4/1989 | Cheng et al. | |
| 4,821,674 A | 4/1989 | deBoer et al. | |
| 5,046,909 A | 9/1991 | Murdoch | |
| 5,321,634 A | 6/1994 | Obata et al. | |
| 5,321,989 A | 6/1994 | Zimmer et al. | |
| 5,435,682 A | 7/1995 | Crabb et al. | |
| 5,444,637 A | 8/1995 | Smesny et al. | |
| 5,445,491 A | 8/1995 | Nakagawa et al. | |
| 5,452,521 A | 9/1995 | Niewmierzycki | |
| 5,483,138 A | 1/1996 | Shmookler et al. | |
| 5,521,123 A | 5/1996 | Komatsu et al. | |
| 5,552,891 A | 9/1996 | Balzer | |
| 5,573,728 A | 11/1996 | Loesch et al. | |
| 5,625,297 A | 4/1997 | Arnaudov et al. | |
| 5,726,066 A | 3/1998 | Choi | |
| 5,746,513 A | 5/1998 | Renken | |
| 5,775,808 A | 7/1998 | Pan | |
| 5,786,704 A | 7/1998 | Kim | |
| 5,844,683 A | 12/1998 | Pavloski et al. | |
| 5,851,370 A | 12/1998 | Maracas et al. | |
| 5,917,601 A | 6/1999 | Shimazaki et al. | |
| 5,929,689 A | 7/1999 | Wall | |
| 5,942,991 A | 8/1999 | Gaudreau et al. | |
| 5,946,083 A | 8/1999 | Melendez et al. | |
| 5,962,909 A | 10/1999 | Jerominek et al. | |
| 5,967,661 A | 10/1999 | Renken et al. | |
| 5,969,639 A | 10/1999 | Lauf et al. | |
| 5,980,194 A | 11/1999 | Freerks et al. | |
| 5,993,141 A | 11/1999 | Wytman | |
| 6,002,840 A | 12/1999 | Hofmeister | |
| 6,048,162 A | 4/2000 | Moslehi | |
| 6,051,113 A | 4/2000 | Moslehi | |
| 6,111,520 A | 8/2000 | Allen et al. | |
| 6,195,246 B1 | 2/2001 | Livesay et al. | |
| 6,198,176 B1 | 3/2001 | Gillette | |
| 6,208,751 B1 | 3/2001 | Almogy | |
| 6,244,121 B1 | 6/2001 | Hunter | |
| 6,313,596 B1 | 11/2001 | Wyka et al. | |
| 6,352,466 B1 | 3/2002 | Moore | |
| 6,368,049 B1 | 4/2002 | Osaka et al. | |
| 6,468,816 B2 | 10/2002 | Hunter | |
| 6,517,418 B2 | 2/2003 | Engdahl et al. | |
| 6,532,403 B2 | 3/2003 | Beckhart et al. | |
| 6,542,835 B2 | 4/2003 | Mundt | |
| 6,603,117 B2 | 8/2003 | Corrado et al. | |
| 6,642,853 B2 | 11/2003 | Hunter | |
| 6,648,730 B1 | 11/2003 | Chokshi et al. | |
| 6,871,660 B2 | 12/2003 | Freed | |
| 6,677,166 B2 | 1/2004 | Hunter | |
| 6,691,068 B1 | 2/2004 | Freed et al. | |
| 6,723,981 B2 | 4/2004 | Corrado et al. | |
| 6,738,722 B2 | 5/2004 | Polla et al. | |
| 6,830,650 B2 * | 12/2004 | Roche et al. | 156/345.24 |
| 7,192,505 B2 * | 3/2007 | Roche et al. | 438/10 X |
| 2002/0038164 A1 | 3/2002 | Osaka et al. | |
| 2002/0078770 A1 | 6/2002 | Hunter | |
| 2002/0092369 A1 | 7/2002 | Hunter | |
| 2002/0101508 A1 | 8/2002 | Pollack | |
| 2003/0001083 A1 | 1/2003 | Corrado | |
| 2003/0115978 A1 | 6/2003 | Moehnke et al. | |
| 2003/0127589 A1 | 7/2003 | Corrado et al. | |
| 2003/0198376 A1 | 10/2003 | Sadighi et al. | |
| 2003/0202092 A1 | 10/2003 | Sadighi et al. | |
| 2003/0209097 A1 | 11/2003 | Hunter | |
| 2004/0031340 A1 | 2/2004 | Renken | |
| 2004/0236524 A1 | 11/2004 | Mundt | |
| 2005/0011611 A1 * | 1/2005 | Mahoney et al. | 156/345.24 |
| 2005/0028049 A1 | 2/2005 | Poolla et al. | |
| 2005/0039852 A1 * | 2/2005 | Roche et al. | 156/345.24 |
| 2005/0126315 A1 * | 6/2005 | Hunter | 73/865.9 |
| 2007/0022832 A1 * | 2/2007 | Hunter | 73/865.9 |

FOREIGN PATENT DOCUMENTS

| | | |
|---|---|---|
| JP | 2-268561 | 11/1990 |
| JP | 3-214783 | 9/1991 |
| JP | 7-74229 | 3/1995 |
| JP | 7-280644 | 10/1995 |
| JP | 8-064654 | 3/1996 |
| JP | 8-233855 | 9/1996 |

OTHER PUBLICATIONS

"Wafercam™ System: Wireless Camera System for Semiconductor Processing Robotic Arm Calibration," www.gtweed.com/semiconductor/Wafercam.htm, 3 pages, 2002.

* cited by examiner

SENSOR DEVICE FOR NON-INTRUSIVE DIAGNOSIS OF A SEMICONDUCTOR PROCESSING SYSTEM

CROSS-REFERENCE TO RELATED APPLICATIONS

This application is a continuation of U.S. patent application Ser. No. 11/052,161, filed Feb. 7, 2005, which is a continuation of U.S. patent application Ser. No. 10/445,598, filed May. 27, 2003 and issued as U.S. Pat. No. 6,895,831, which is a continuation of U.S. patent application Ser. No. 10/083,899, filed Feb. 27, 2002 and issued as U.S. Pat. No. 6,677,166, and U.S. patent application Ser. No. 10/084,290, filed Feb. 27, 2002 and issued as U.S. Pat. No. 6,642,853, which are divisional applications of U.S. patent application Ser. No. 09/816,806, filed Mar. 23, 2001 and issued as U.S. Pat. No. 6,468,816, which is a divisional application of U.S. patent application Ser. No. 09/036,247, filed Mar. 6,1998 and issued as U.S. Pat. No. 6,244,121. All of the above are hereby incorporated by reference in their entireties.

BACKGROUND OF THE INVENTION

1. Field of the Invention

The present invention generally relates to methods and apparatuses for testing or aligning the various parts of a processing system. Specifically, the present invention relates to methods and apparatuses for leveling and aligning the processing system and the various structures within the processing system that support and/or transfer processing objects, such as substrates, through the processing system so that the processing system and each structure is substantially level and so that each structure receives, supports and/or transfers the substrates in substantially the same inclination and without slippage of or damage to the substrates.

2. Background of the Related Art

Processing systems for processing 100 mm, 200 mm, 300 mm or other diameter substrates are generally known. Typically, such processing systems have a centralized transfer chamber mounted on a monolith platform. The transfer chamber is the center of activity for the movement of substrates being processed in the system. One or more process chambers mount on the transfer chamber at slit valves through which substrates are passed by a substrate handler, or robot. Access to the transfer chamber from the clean ambient environment is typically through one or more load lock chambers attached at other slit valves. The load lock chambers may open to a very clean room, referred to as the white area, or to an optional substrate handling chamber, typically referred to as a mini-environment.

In addition to the substrate handler disposed within the transfer chamber, a processing system may have several other structures, including, but not limited to, indexers in the load lock chambers, lift pins in the process chambers, and substrate chucks in the process chambers, which will support or handle the substrates in one manner or another. The lift and support structures within the processing system may exchange substrates more rapidly, without slippage or backside contamination of the substrates, if the lift and support structures are level. Additionally, the extremely fine and delicate nature of the circuits and other structures being constructed on the substrates may require that the processing system as a whole, and particularly each substrate support structure, be set as near to level as possible. Typically, assemblers or operators of the processing systems may try to ensure that, at a minimum, the various substrate support structures are in alignment relative to each other, so that even if each support structure is not perfectly level, at least they are all at the same inclination. Additionally, the assemblers or operators will attempt to ensure that the substrate support structures, which move the substrates laterally, accelerate and decelerate at suitable rates and without discontinuous, or jerking, motion, so that the substrates do not slip on the support structure. Failure to ensure that the processing system and/or each of the substrate support structures is properly level and/or aligned and is operating smoothly may cause damage to or improper processing of the substrates and can reduce the throughput of the processing system since substrate exchanges may not be performed at maximum speed.

Relative alignment of the substrate support structures is typically more important than absolute leveling of the entire processing system since substrate exchange handling can result in significant slippage due to improper alignment. When the substrate support structures, within a processing system, are improperly aligned, however, the support structures do not hold the substrates at about the same inclination, or tilt. Thus, when one support structure transfers a substrate to another support structure, such as when the lift pins remove a substrate from a blade of the transfer chamber substrate handler or place a substrate onto the substrate chuck in a process chamber, one point of the substrate will always touch the receiving support structure before other points do. If substantial motion occurs prior to the remaining points making contact, then the substrate can slip. In this manner, potentially contaminating particles may be scraped from the contacting points of the substrate causing backside contamination of the substrate. These particles may eventually work their way around to the top of the substrate and be deposited on the processed surface of the substrate, thereby contaminating the micro circuits or other structures constructed thereon. Additionally, when the substrate does not touch a receiving support structure with all points in very close alignment, then the substrate may be shifted from its proper, or expected, position, so that the substrate is off-center. An off-center substrate may undergo uneven or otherwise improper processing or may come in contact with surfaces or objects within the processing system that will contaminate the substrate, create potentially contaminating airborne particles or even break the substrate. Thus, exchanges of the substrate between lifting or supporting structures within the processing system requires a coplanar interface. If the exchange is not coplanar, then the substrate will have the propensity to slip, resulting in misalignment and backside contamination of the substrate.

When a processing system as a whole is improperly leveled, the system chambers, such as the transfer chamber, are inclined at an angle and can cause problems with the handling and processing of substrates and can exacerbate the problems with substrate support structures that are further inclined relative to the processing system. Since the substrate support structures are mounted to the processing system, if the processing system is inclined and the support structures are level relative to the processing system, then the support structures will also be inclined, though the support structures may, nevertheless, be aligned with each other. When the processing system is inclined, but the support structures are aligned, then the processing system may still operate properly, but possibly at a lower than optimum speed. Additionally, performance of certain functions that are sensitive to gravity may be affected by the inclination of the system. When a transfer chamber substrate handler, for example, accelerates a substrate in a manner that may be appropriate for a level system, the substrate may, nevertheless, slide off-center due to the inclination, thereby exposing the substrate to potential damage from particles that may be generated by the slide or to potential collision with a surface or object in the processing system that requires a relatively close centering tolerance of the substrate for clearance.

The substrate support structures typically may be leveled independently within the processing system. Thus, after the transfer chamber and the processing chambers are leveled as a whole, the transfer chamber substrate handler or the process chamber lift pins or chuck may be additionally leveled independently. It is even possible for a substrate handler to be fairly level while the transfer chamber is significantly inclined, or vice versa. In such manner, the substrate handler may be aligned with an opening through which it passes substrates to and from a process chamber on one side of the transfer chamber, yet be out of alignment with an opening for a process chamber on the opposite side of the transfer chamber. Therefore, the transfer chamber substrate handler must be fairly closely aligned with the inclination of the transfer chamber to permit proper functioning of the entire system.

FIG. 1a shows a prior art method of determining the inclination of a transfer chamber substrate handler 10. The transfer chamber 12 is shown with a lid 14 partially lifted to expose the interior of the chamber body 16. The substrate handler 10 is mounted in about the center of the transfer chamber 12 and rotates about a center point. The substrate handler 10 extends a blade 18 to insert a substrate 20 through a slit valve opening 22 to access a process chamber (not shown) or a load lock chamber (not shown) mounted to the facets 24. To determine the inclination of the blade 18, an operator places a level, such as a bubble level, 26 onto the blade 18 and reads the inclination through a window in the level 26. The level 26 may be placed directly onto the blade 18, or the level 26 may be placed onto a substrate 20 sitting on the blade 18. The inclination of the blade 18 must be measured in each relevant direction with the blade 18 retracted as shown and with the blade 18 extended through the slit valve 22, so the substrate handler 10 can function properly throughout all of its movements. The actual leveling of the substrate handler 10 may involve adjusting the transfer chamber 12 relative to a support platform (not shown), adjusting the base 28 relative to the transfer chamber 12 and adjusting the arms 30, linkages 32 and blade wrist 34.

There are several problems with the measurement method depicted in FIG. 1a. The substrate handler 10 must be still, for example, so the operator can read the level 26, since the acceleration of the blade 18 would affect the level 26. Therefore, the inclination of the blade 18 while the blade is in motion is unknown. Additionally, the lid 14 must be removed, so the operator can access the substrate handler 10. Therefore, the processing system must be shut down, so the lid 14 can be removed, intruding into the clean environment; and the ambient air must be more highly filtered of particles than usual, so the interior of the transfer chamber 12 is not contaminated. Also, the level 26 does not fit through the slit valve openings 22, so the operator must remove the level 26 from the blade 18 to extend the blade 18 into a process chamber and then place the level 26 back onto the blade 18. Therefore, the process chamber must also be opened, exposing the process chamber to possible contamination and further increasing the downtime of the system. Furthermore, the levels used to measure the inclination typically can resolve the inclination to within only two or three degrees accuracy, are highly dependent on the skill of the operator who is reading the level, and can affect the blade deflection due to the weight of the level, itself. Therefore, process systems or processes that are particularly sensitive to misalignment may be adversely affected. Because of the problems and difficulties with performing this measurement method, some operators may elect not to make these measurements very thoroughly or even not to make them at all.

FIG. 1b shows another prior art method for determining the inclination of a substrate 20 seated on a substrate handler blade 18 within a processing system. A stationary laser 36 mounts to a surface 38 in the processing system, typically the floor of the transfer chamber, and directs a laser beam 40 into the path of the substrate 20 as the substrate moves through the system in the direction of arrow A. This method may be performed during normal processing of substrates in the processing system or just whenever needed. When the leading edge 42 of the substrate 20 intersects the laser beam 40, the laser 36 detects the distance to the substrate 20. Then just before the trailing edge 44 moves out of the laser beam 40, the laser 36 detects the distance to the substrate 20, again. If the two distances are about the same, then the substrate 20 is aligned with the surface 38 of the processing system in the particular axis measured. However, this method does not determine if the substrate 20 is level. Rather, this method determines the alignment of the substrate 20 relative to the chamber through which it is being transferred, so the problems with an inclined substrate 20 or blade 18, as described above, may still occur. Additionally, this method can determine the inclination of the substrate 20 in only one axis, the direction of movement. Since the laser 36 does not move, if the operator wants to determine the inclination of the substrate 20 in a different axis, then one or more other lasers will have to be mounted in the processing system to determine the distance to other points on the substrate 20. Furthermore, since the laser 36 is not moveable, this method determines the inclination of the substrate 20 at only one location, so if the operator wants to determine the inclination of the substrate 20 at a different location, such as at the opposite side of the transfer chamber, then additional lasers will have to be mounted at that location. Moreover, since the laser 36 is mounted into the processing system, removal of the laser 36 is either impossible or very difficult. Additionally, contaminants may prevent the proper functioning of the optics. Furthermore, a warped substrate may lead the laser sensors to incorrectly determine that the blade or substrate is inclined. Therefore, although this method can be performed without opening the processing system, this method is very inflexible.

During processing, the blade 18 in many processing systems is constantly moving between areas of high and low temperatures, such as hot process chambers and cool load lock chambers. The frequent temperature variations may cause the blade 18 to suffer "blade wilt," wherein the blade 18 becomes warped due to expansion and shrinkage resulting from the temperature changes. Thus, over time, the blade 18 may be warped out of alignment, so the blade 18 may degrade and hold the substrates at an unacceptable inclination. Other shifting of alignments between the various substrate support structures, due to the wear or slippage from constant movement during processing, may also occur. To reestablish confidence in the alignment of the substrate support structures, the processing system must have built-in inclination detection systems, such as the one shown in FIG. 1b, or the operator must stop the processing system and open it up to diagnose the condition of the support structures with a method such as the one shown in FIG. 1a. Because of the down-time associated with the method shown in FIG. 1a, many operators elect not to perform the method or to wait until the substrate support structures are severely out of alignment and potentially damaging the substrates.

Therefore, a need exists for an apparatus and method for determining the inclination and alignment of various substrate handling mechanisms of a processing system, but that is very flexible, does not intrude into the clean environment of the processing system, is fast, and provides a very thorough diagnosis of the system alignments.

SUMMARY OF THE INVENTION

A battery powered sensing device for diagnosing a processing system and method for using the same are provided. The support platform generally has physical characteristics, such as size, profile height, mass, flexibility and/or strength, substantially similar to those of the substrates that are to be processed in the processing system, so the sensor device can be transferred through the processing system in a manner similar to the manner in which production substrates are transferred through the processing system.

In one embodiment, an apparatus for obtaining information from within a processing system includes a battery powered sensing device sized for robotic transfer between a central transfer chamber and a vacuum processing chamber of the processing system, wherein the device is configured for obtaining information of a condition within the processing system.

In another embodiment, a method of obtaining information from within a processing system includes robotically moving a battery powered sensing device through a slit valve disposed between a central transfer chamber and a vacuum processing chamber of a processing system, and obtaining, via the sensing device, information of a condition within the processing system.

Another embodiment of the present invention may be a sensor device generally having a support platform and one or more sensors mounted on the support platform. The sensor senses a condition, such as direction or inclination or acceleration in one or two axes, of the sensor device and outputs a signal indicative thereof. The sensor sends the signal to a conversion circuit, such as an analog-to-digital converter, for converting the signal into a digital signal, which is then sent to a transmitter, also mounted to the support platform, for wireless transmission of the signal to a receiver mounted on or near the processing system.

The support platform generally has physical characteristics, such as size, mass and stiffness, substantially similar to those of the substrates being processed in the processing system, so the sensor device can be transferred throughout the processing system in a manner similar to the manner in which production substrates are transferred. Thus, the sensor device is conveyed through the processing system non-intrusively, i.e. without opening the isolated portions of the system. Also, the sensor device, while moving through the processing system, detects and transmits the sensed inclination, orientation or other information.

The support platform may be a substrate, and the sensor(s) and other circuits/devices on the support platform may be micro-machined directly into the material of the substrate to form a low-profile sensor device having a total mass near the mass of a production substrate. In an alternative embodiment, a ceramic chip carrier may be mounted to the support platform, with a die for the sensor(s) and other circuits/devices formed into the ceramic chip carrier to provide a fairly lightweight and cost-effective sensor device. In yet another alternative embodiment, the sensor(s) and other circuits/devices may be constructed of surface-mount integrated circuit chips mounted to the support platform to provide a cost-effective sensor device.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
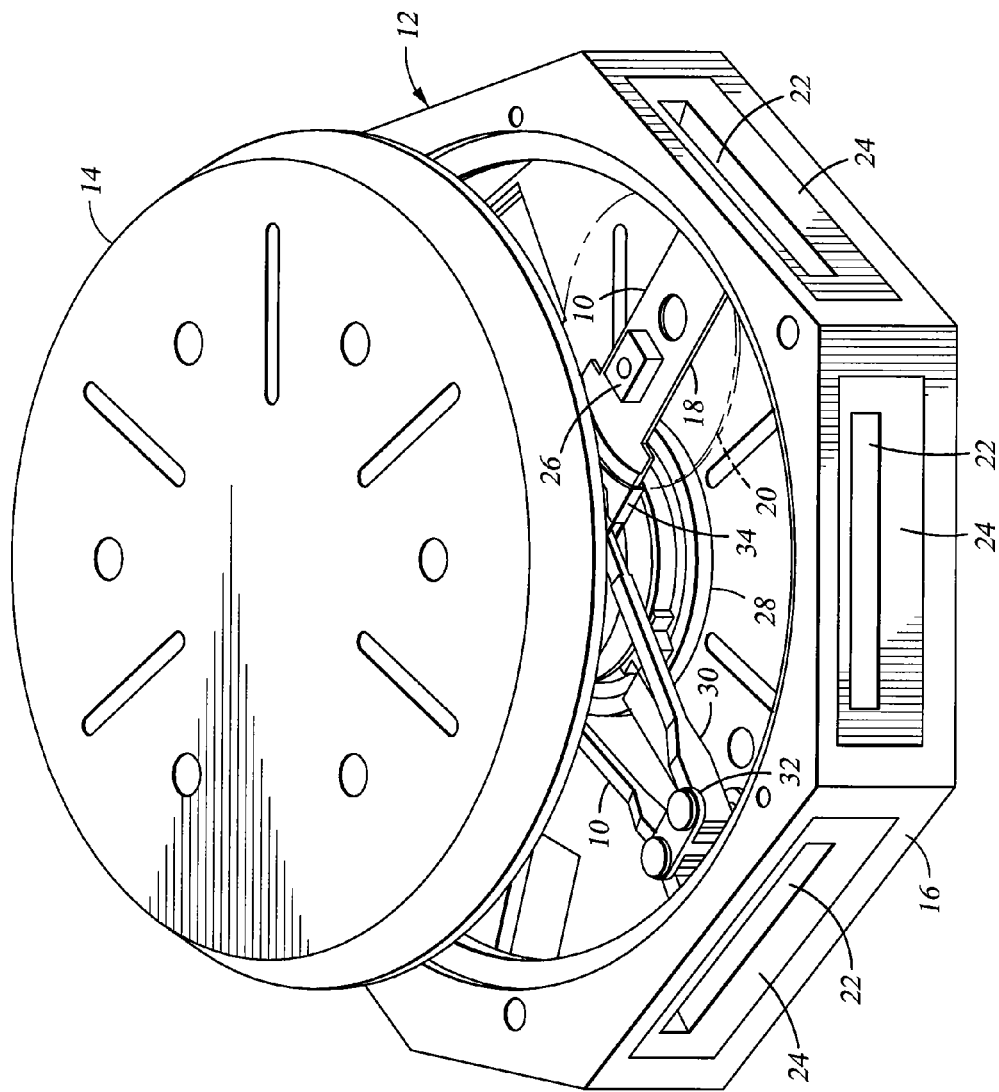
FIG. 1a is a perspective view of a prior art sensor device in a process chamber.
FIG. 1b is a side view of a prior art sensor system.
Figure 1B:
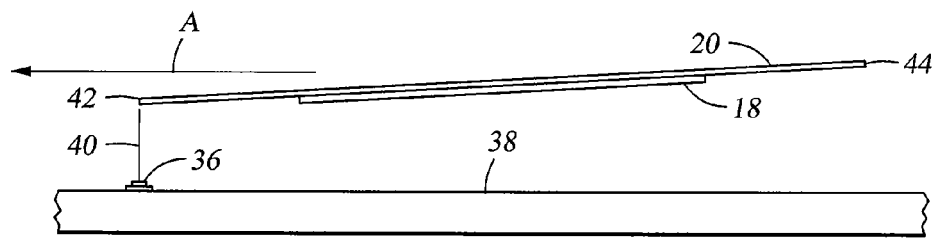
Figure 2A:
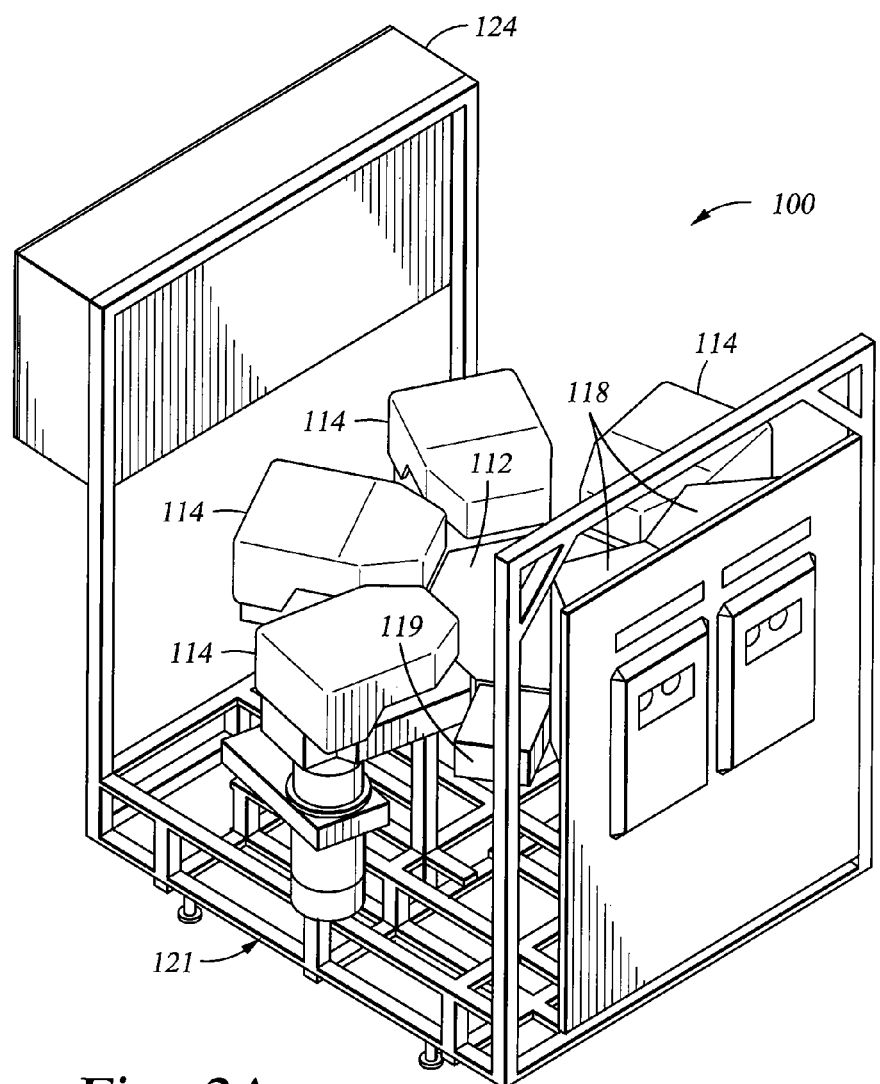
FIG. 2a is a perspective view of a processing system.
Figure 2B:
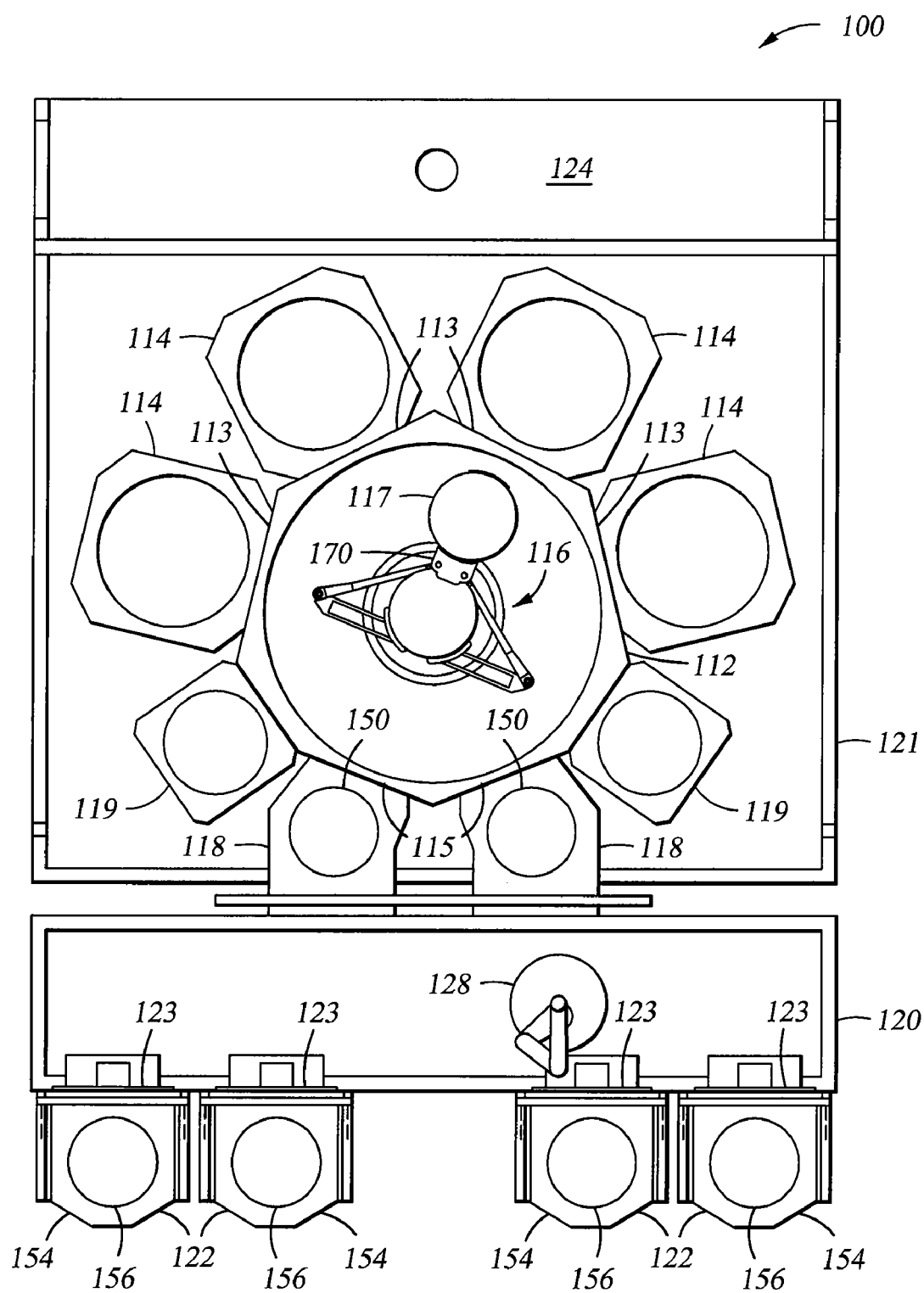
FIG. 2b is a schematic top view of a processing system.

FIGS. 2a and 2b show two configurations for an exemplary processing system 100 of the present invention. The processing system 100 is typically disposed in a clean environment of a manufacturing facility. The processing system 100 and an example of its function will be described in detail below. Generally, the processing system 100 includes a central transfer chamber 112, one or more process chambers 114, one or more load lock chambers 118, one or more expansion or cool-down chambers 119, a platform frame 121, a gas panel 124 and an optional external substrate handling system 120, referred to herein as the mini-environment. Some of the processes that a processing system 100 may perform on a substrate, or wafer, in the process chambers 114 require the use of process fluids and/or gases, so the process chambers 114 have fluid lines (not shown) for delivering the process fluids and/or gases to the process chambers 114 from the gas panel 124. A transfer chamber substrate handler, or robot, 116 and a mini-environment substrate handler 128 are disposed in the transfer chamber 112 and mini-environment 120, respectively, and move substrates 117, 156 through these chambers to and from the various chambers attached thereto.

The substrates enter the process system 100 from pod loaders 122 having pods 154 seated thereon containing several substrates 156. Several structures, such as the substrate handlers 116, 128, chucks, lift pins, load lock indexers and the like, support the substrates as the substrates are moved through and processed in the system 100. To prevent damage to or improper processing of the substrates, the inclination of each of the support structures must be very closely aligned and leveled, and the movement of the support structures and substrates must be smooth. To determine the inclination and movement of the substrates without shutting down the system 100 for a significant period of time and opening up the system 100 to expose the interior of the system 100 to potential contamination, a sensor device 200 (FIG. 3) is entered into the system 100 from a pod loader 122 and transferred through the system 100 in a manner similar to the manner that the system 100 handles the substrates, i.e. production substrates, that are to be processed. The sensor device 200 is an active probe which can be entered into the system 100 to investigate many aspects or conditions of the system 100. The sensor device 200 generally includes a support platform 202 and several electronic devices, such as an inclinometer 204, an accelerometer 206, a directional compass 208, an analog to digital (A/D) converter 210, a transmitter 212, a power source 214 and a switch 216. In addition, a small processor (not shown) for pre-filtering data may be incorporated in the circuitry.

In the illustrated embodiment, the inclinometer 204 mounts to the support platform and senses the inclination of the sensor device 200 and, hence, of the substrate handler or other support structure. The inclinometer 204 receives electrical power from the power source 214, such as a lithium-ion battery and power conditioner, and sends signals indicative of the sensed inclination to the A/D converter 210. In one embodiment, the inclinometer 204 is a two-axis inclinometer for sensing the inclination of the sensor device 200 in two axes at 90°, so the overall inclination of the sensor device 200 can be determined from a suitable calculation. After initial assembly of the processing system 100, the sensor device 200 can be used to adjust the inclination of each support structure by transferring the sensor device 200 through the processing system 100 to each support structure, sensing the inclination of each support structure at the time that the sensor device 200 is disposed thereon and adjusting each support structure as described below to align each support structure. As described in the background, a misalignment between two support structures can cause particles to be generated or can result in an uncertain positioning of the substrate when one of the support structures transfers a substrate to the other support structure, so proper alignment of the support structures is essential.

An exemplary inclinometer 204 includes a cavity partially filled with a conductive fluid, such as mercury, and an array of probes disposed vertically in the cavity into the conductive fluid. As the inclinometer 204 inclines, the probe at one end of the array will have a greater contact, and less resistance, with the conductive fluid than will the probe at the opposite end of the array. The variation in resistances sensed at each of the probes determines the inclination of the inclinometer 204. Such inclinometers, having a profile height of about ½ inches, are commercially available and can sense an inclination of up to about thirty to forty degrees. However, the inclinometer 204 needs to be able to sense an angle of only about five to ten degrees, since the typical processing system 100 can generally be assembled in such a manner that the inclination of any given support structure is within this range. Therefore, a suitable inclinometer 204 may be constructed having a mass and profile height significantly less than currently available inclinometers. It is understood that the invention is not limited to the type of inclinometer described, but rather, contemplates the use of any suitable inclinometer.

Figure 8:
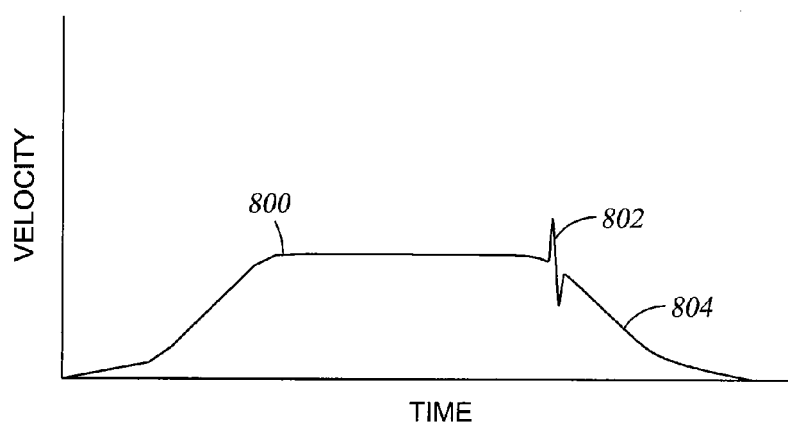
FIG. 8 is a graph of the velocity of the sensor device during movement.

The accelerometer 206 mounts to the support platform and senses the acceleration of the sensor device 200 and, hence, of the substrate handler or other support structure. The accelerometer 206 receives electrical power from the power source 214 and sends signals indicative of the sensed acceleration to the A/D converter 210. In one embodiment, the accelerometer 206 is a two-axis accelerometer for sensing the acceleration of the sensor device 200 in two axes, so the overall acceleration of the sensor device 200 can be determined from a suitable calculation. Similar to the inclinometer 204, the accelerometer 206 senses the acceleration, or change in motion, of the sensor device 200 while the processing system 100 transfers the sensor device 200. For best throughput, the substrate handlers need to be operated at the highest speed possible, but an acceleration in a particular axis that is too great for static friction to hold a substrate on a moving support structure, about 0.2 G's or greater, may indicate a potential for slippage of the substrate on the support structure during movement, resulting in an uncertain positioning of the substrate, further resulting in damage to or improper processing of the substrate. Actual slippage of the sensor device 200 or malfunctioning of a substrate handler 116, 128 may be determined by the sensor device 200 when the sensed acceleration of the sensor device 200 is not substantially the same as the anticipated acceleration during a particular movement, indicating that the sensor device 200 did not move in the same manner as the substrate handler 116, 128 or the substrate handler 116, 128 moved in an unanticipated manner, such as a jerking, irregular movement. FIG. 8 graphically illustrates such an irregular movement. The graphed curve is velocity plotted versus time; however, other plots, such as acceleration vs. time or inclination vs. time, may be used. In regions 800 and 804, the velocity smoothly increases until it reaches a constant velocity and then smoothly decreases, but in region 802, an irregular movement causes a sharp rise, or discontinuity, in the curve, indicating a problem with the movement of the substrate handler 116, 128. Thus, the sensor device 200 can detect an improper movement by a substrate handler 116, 128.

In an alternative embodiment, the inclinometer 204 may determine the acceleration of the sensor device, instead of by a separate accelerometer; thereby, reducing the number of devices on the sensor device 200. The inclinometer 204 described above includes a fluid in a cavity, so as the inclinometer 204 is accelerated, the force of acceleration on the fluid will force the fluid to one end of the cavity; thereby, falsely indicating an inclination of the sensor device in the direction of acceleration. A suitable procedure can resolve this false inclination to an acceleration.

The directional compass 208 provides the ability of the sensor device 200 to determine the horizontal angle, or compass direction, of the sensor device 200 from magnetic north. Thus, as the substrate handler 116, 128 or other support structure moves the sensor device through the system 100, the compass direction of the sensor device 200 can be determined at any point in the trajectory of the sensor device. The anticipated compass direction of the sensor device 200 can be compared with the actual compass direction to confirm proper movement of the sensor device 200. Additionally, the inclination of the entire system 100 can be determined by determining the inclination of the sensor device 200 at corresponding compass direction points as the substrate handler 116 rotates about a 360°angle. With this data, the inclination of the system 100 can be resolved with a suitable procedure.

The A/D converter 210 receives the analog signals from each of the devices 204, 206, 208 and converts the signals into digital signals, which are then packetized for transmission via the transmitter 212 to a receiver. Other methods and apparatuses for transferring the signals from the sensor device 200 will be readily apparent to a person skilled in the art. Such other methods and apparatuses may include, but not be limited to, a transmission system for sending the analog signals to a receiver, so as to save the weight of the A/D converter 210 on the sensor device 200.

The transmitter 212 may be any appropriate transmitter device, such as an optical transmitter or RF based transmitter, for sending signals the relatively short distance from the interior of the system 100 to the exterior. Thus, the transmitter 212 may be an inexpensive low-power transmitter device.

One or more receivers 218 are mounted on the system 100 to receive the signals from the transmitter 212 and send the signals to a controller system for the system 100. The receivers may be located on the interior of the system 100 and send the signals over wires through the walls of the system 100. However, to avoid having to modify the system 100 for wires to pass through the system walls, it is preferred that the receivers 218 be located on the exterior of the system 100 at any appropriate aperture, such as at the viewing ports 220 in the lid of the transfer chamber 112 (FIG. 4), where RF signals can be conveyed out of the system 100 with a minimum of interference.

The power source 214 may be any appropriate device, such as a lithium-ion battery in conjunction with a power conditioner for obtaining proper working voltages, which is lightweight and provides sufficient power for sufficient time to conduct all of the measurements necessary for the system 100. The battery may be rechargeable for repeated use, or it may be replaceable in a suitable receptacle. The switch 216 turns the power on and off to the electronic devices on the sensor device 200.

Figure 3:
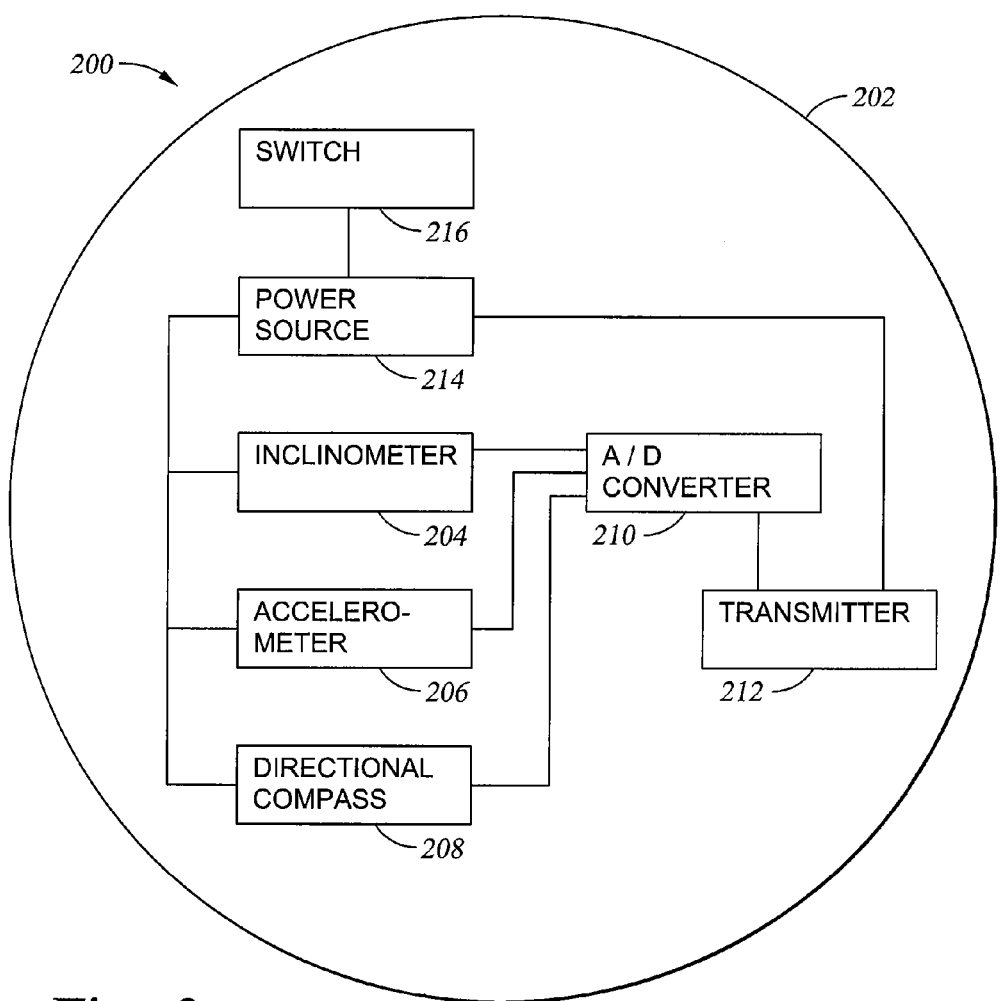
FIG. 3 is a schematic block diagram of a sensor device.

It is understood that the invention is not limited to the sensor device 200 depicted in FIG. 3 and described herein, but contemplates other configurations of sensor devices or active probes, including but not limited to the examples described below, that may be transferred through a processing system and may have any number of different combinations and types of electronic devices for sensing conditions within the system 100. For example, a magnetic probe that includes hall effect magnetic field sensors may allow magnetic fields to be characterized within the system 100 while the system 100 is closed. Thus, an operator may adjust the rotation of a magnetron or the current flowing through a variety of coils in a process chamber to ensure uniformity of magnetic fields created therein and of a plasma created thereby within the process chamber while receiving immediate feedback of the actual conditions of the fields.

Another type of probe may provide characterization of an electrostatic chuck, which holds a substrate in place using an electrostatic charge during processing. This probe may determine the performance of various charge abatement strategies used to release the substrate so the substrate may be picked up and removed by a substrate handler. The probe may also detect dielectric punch-throughs, a condition in which charge differential between the electrostatic chuck and the substrate is lost due to discharge holes in the non-conductive face of the electrostatic chuck. One embodiment of such an electrostatic probe has a micro machine and/or circuit on a substrate platform including a diaphragm element which deflects toward the electrostatic chuck as a function of charge. The magnitude of this deflection indicates the charge differential between the probe/substrate and the electrostatic chuck. The electronic devices on the electrostatic probe must be fabricated to withstand the environment adjacent the electrostatic chuck since this environment is usually hostile to active electronics.

Yet another probe may be a temperature probe including temperature sensors to map thermal characteristic of an environment inside the system 100. Many process chambers and systems 100 operate at very high temperatures, such as above 300° C., so since most electronics only work up to about 80° C., the probe may only be used if the system 100 is operated at a lower temperature. The temperature probe may be used to develop or validate basic temperature control schemes within the system 100 or individual process chambers. Additionally, a temperature probe which can detect a thermal gradient across the length of the probe may determine uniformity of process gas distribution within a process chamber since a small gradient indicates that the process gas has been evenly distributed over the probe. The thermal gradient probe must account for disruptions in the normal flow of the process gases due to any structures on the surface probe. For use in a process chamber having a shower head gas inlet at the top of the process chamber and which can rotate a substrate for even processing, such as in some chemical vapor deposition chambers, a configuration for a temperature probe includes an array of temperature sensors on the probe platform orientated radially out from the center thereof with spacing matching the spacing of the gas apertures of the shower head. As the probe is rotated, it can detect a change in temperature associated with the gas exiting each aperture, so clogged apertures may be detected by an unexpected temperature variation. An embodiment for this example may include piezoelectric detectors which deflect when subjected to the gas stream in front of the aperture.

Another active probe is a distance probe which can ensure that the wafer surface is both parallel to and at the proper distance from the target or shower head of the process chamber. Embodiments of a distance probe may include contacting sensors or electro-optical sensors arranged at a sufficient number of locations on the surface of the probe platform to determine the distance from and angle of inclination between the probe and the target or shower head. Since the distance probe sits on a chuck in the process chamber when the distance measurements are performed, the mass of the probe is not a significant issue, so the weight of the distance probe may be increased if necessary to reduce the cost.

Yet another type of probe may be an optical source detection probe for detecting a light beam, infrared beam or other optical signal from a source thereof to determine whether the source is operating within normal or acceptable limits. Such optical sources may be part of an optical sensor system within a system 100 for providing feedback to a system controller regarding the performance of parts of the system 100, such as a substrate edge detection sensor system for automatic center finding of substrates being processed within the system 100. If the optical source detection probe determines that a source is not operating within acceptable limits, then the optical source may be defective or the optical pathway of the optical beam signal from the source may be contaminated or blocked, so the system 100 may require servicing or maintenance.

Figure 4:
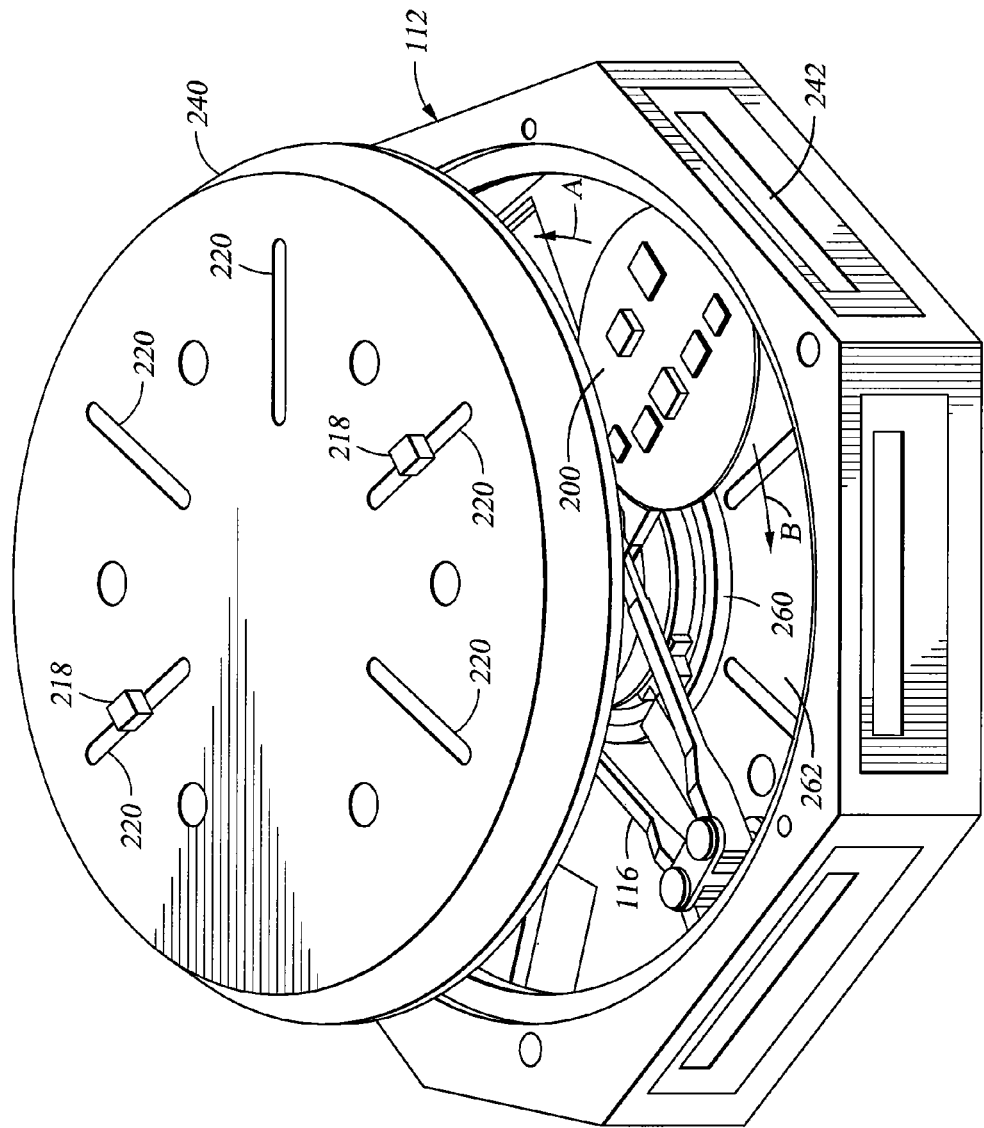
FIG. 4 is a perspective view of a sensor device in a transfer chamber.

FIG. 4 shows a sensor device 200 positioned on the substrate handler 116 inside the transfer chamber 112 with the transfer chamber lid 240 partially raised. The substrate handler 116 moves the sensor device 200 back and forth in the directions of arrows A and B and/or holds the sensor device 200 relatively motionless at any location inside the transfer chamber 112 while the sensor device 200 takes the desired measurements and transmits the information to the receivers 218 positioned on the exterior of the transfer chamber 112.

Figure 5:
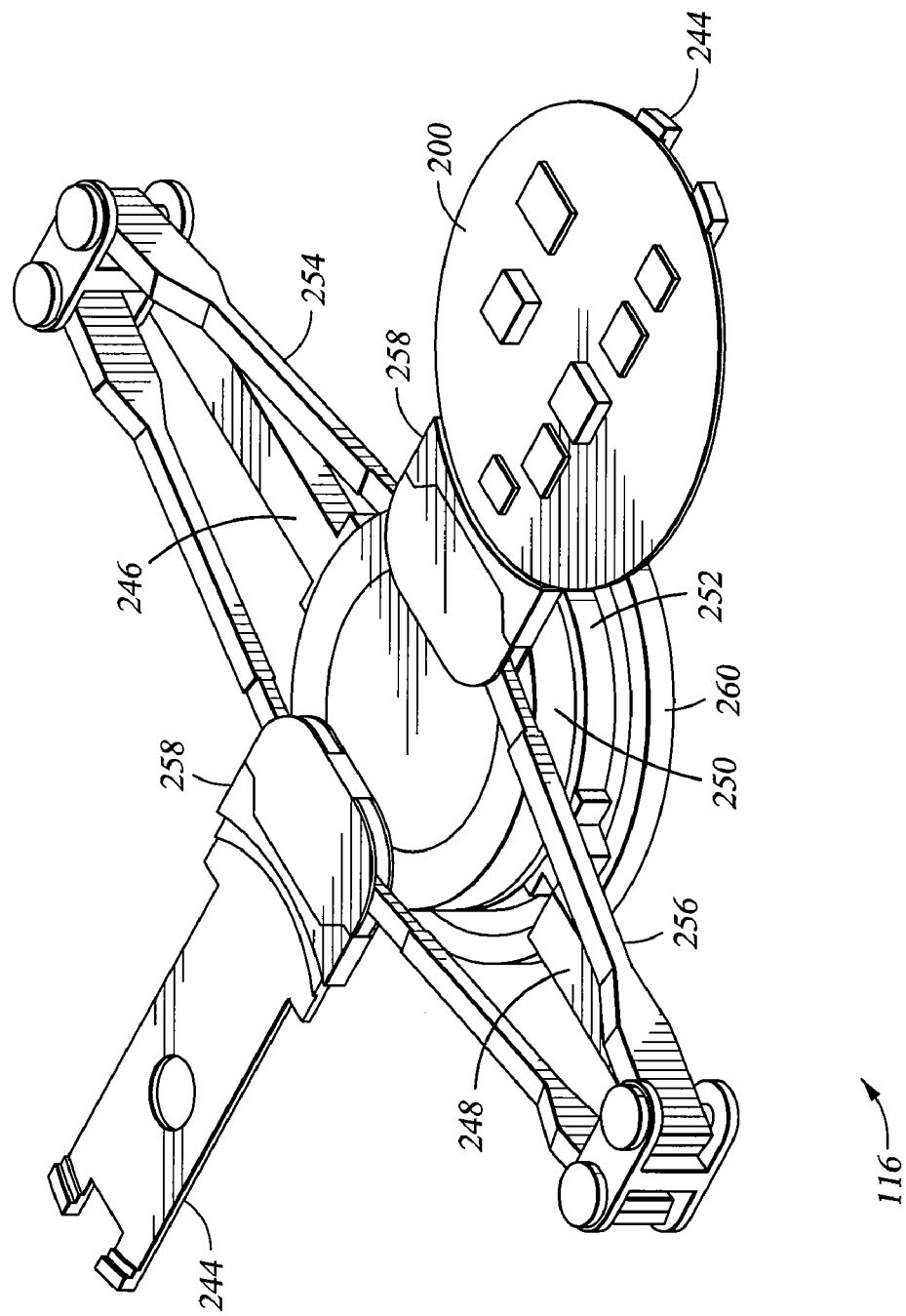
FIG. 5 is a perspective view of a sensor device on a substrate handler.
Figure 6:
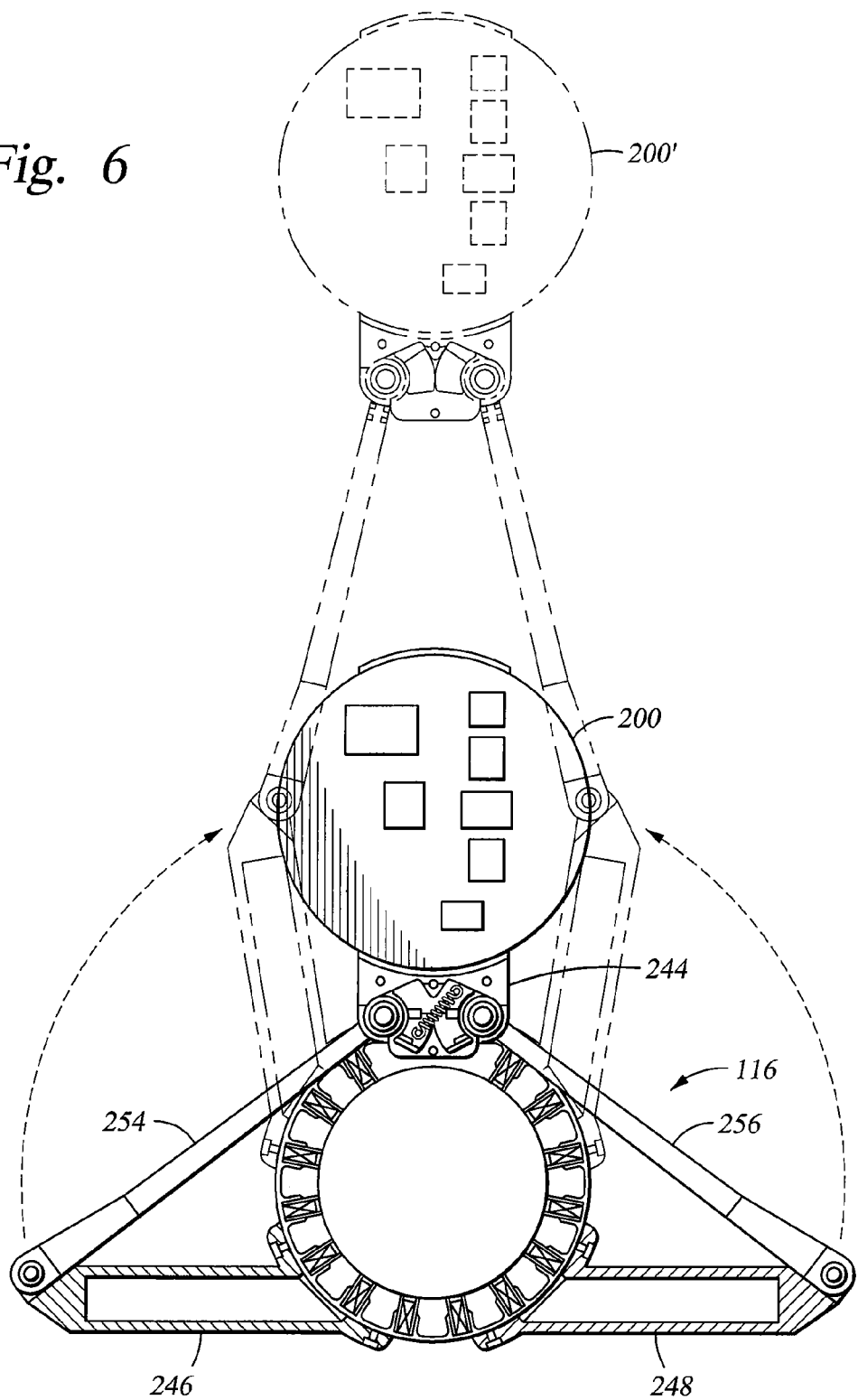
FIG. 6 is a top view of a sensor device on another substrate handler.

FIGS. 5 and 6 show two different types, single bladed and double bladed, of substrate handlers 116 for illustrative purposes; however, both substrate handlers 116 perform the functions of rotating the sensor device 200 within the transfer chamber 112 and extending the sensor device 200', as shown by the dashed lines in FIG. 6. The substrate handler 116 has a blade 244 for holding the sensor device 200. The blade 244 attaches at a wrist 258 to articulating arms 254, 256, which attach to actuating arms 246, 248, which attach to upper and lower rotating members 250, 252, respectively, to rotate back and forth to rotate the sensor device 200 and/or to extend or retract the sensor device 200. Each joint of the substrate handler 116 must be carefully aligned for the movement of the sensor device 200 to be proper. In other words, the blade 244 must be properly attached and aligned to the articulating arms 254, 256 at the wrist 258, the articulating arms 254, 256 must be properly aligned with respect to the actuating arms 246, 248, and the actuating arms 246, 248 must be properly aligned with the upper and lower rotating members 250, 252 for the inclination of the blade 244 to be proper. Any misalignment in any of the joints, of the substrate handler 116, or in the alignment between the substrate handler base 260 and the transfer chamber floor 262, can cause the blade 244 to be improperly inclined, and the inclination can be detected by the sensor device 200.

Mechanical tolerances and mechanical pre-loads in each of the joints of the substrate handler 116 can make accurate alignment of the blade 244 extremely difficult. Thus, it is very undesirable to have to replace and realign the blade 244. However, the blade 244 is subjected to many rapid variations in temperature during operation of the system 100, so the blade 244 may undergo blade wilt, or warpage, causing the blade to become inclined or the attachment points at the wrist 258 to yield. If the blade inclination or attachment point yield becomes severe, then the blade 244 or a substrate on the blade 244 may strike an object or surface in the system 100; thereby breaking or otherwise damaging the blade 244 or the substrate. In such an event, the system 100 will have to be turned off and opened to repair or replace the damaged parts, including the blade 244. If the blade 244 is broken, then the wrist 258 or other parts and joints of the substrate handler 116 may be compromised or damaged, so each part of the substrate handler 116 will have to be realigned. To prevent this damage and downtime, the inclination and alignment of the blade 244 should be confirmed periodically. The sensor device 200 provides a way to confirm the inclination and alignment of the blade 244 in all directions without having to turn off and open the system 100; thereby, permitting detection and replacement of a wilted or defective blade before severe damage occurs.

The substrate handler 116 extends, as shown in FIG. 6, to insert the sensor device 200 through a slit valve opening 242 and into an attached process chamber (not shown). The height of the sensor device 200 and all of the electronic devices thereon is such that the sensor device 200 can easily pass through the slit valve opening 242 while seated on the blade 244. Thus, the sensor device 200 can determine the inclination at the retracted position, extended position or any intermediate position without having to remove the sensor device 200, insert the blade 244 through the slit valve opening 242, and replace the sensor device 200. The sensor device 200 can also determine the acceleration during the extension and retraction of the substrate handler 116.

The operation of the sensor device 200 with a typical process chamber will now be described with reference to FIG. 7. Although FIG. 7 shows a schematic view of a CVD chamber 114, it is understood that the invention is not so limited, but that the substrate handler 116 can insert the sensor device 200 through the slit valve opening 242 into any type of process chamber 114, such as a PVD chamber, a CVD chamber, an etch chamber, a photo lithography chamber or other chamber, and that the sensor device 200 may operate with any of these types of process chambers. The process chamber 114 generally has chamber walls 270, a substrate lift mechanism 272, a substrate support structure 274 and a chamber lid 278. The chamber walls 270 and chamber lid 278 generally define the interior of the process chamber 114. An opening 280 provides access to the interior of the process chamber 114 and matches up with the slit valve opening 242 of the transfer chamber 112 for the substrate handler 116 to insert or remove substrates into or from the interior of the process chamber 114. A process gas shower head 276 disposed in the chamber lid 278 permits a process gas to enter through a gas source 282 and be dispersed into a processing region 286 of the interior of the process chamber 114 through shower head nozzles 284.

Figure 7A:
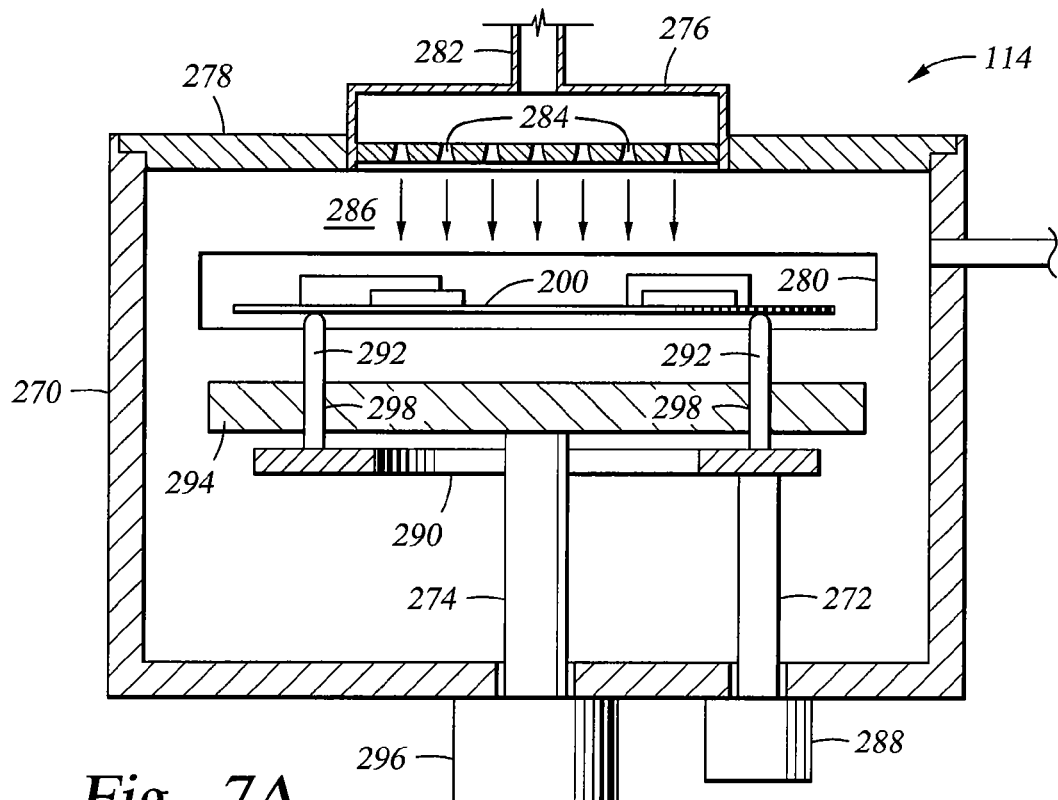
FIG. 7a is a side view of a sensor device in a process chamber in a first configuration.

The substrate lift mechanism 272 generally has lift pins 292 for supporting a substrate (not shown) and mounted on an arm 290 which is, in turn, mounted on a lift rod 288 for raising and lowering the substrate lift mechanism 272. When a substrate is inserted through the opening 280 into the interior of the process chamber 114, the lift mechanism 272 lifts the substrate off of the blade 244 of the substrate handler 116 with the lift pins 292 by raising the lift rod 288 and arm 290 as depicted in FIG. 7a. The blade 244 passes between the lift pins 292 when the lift pins 292 support the substrate. The substrate lift mechanism 272 handles the sensor device 200 in the same manner as it handles a substrate. In this manner, the sensor device 200 is passed from the substrate handler 116 to the substrate lift mechanism 272.

Figure 7B:
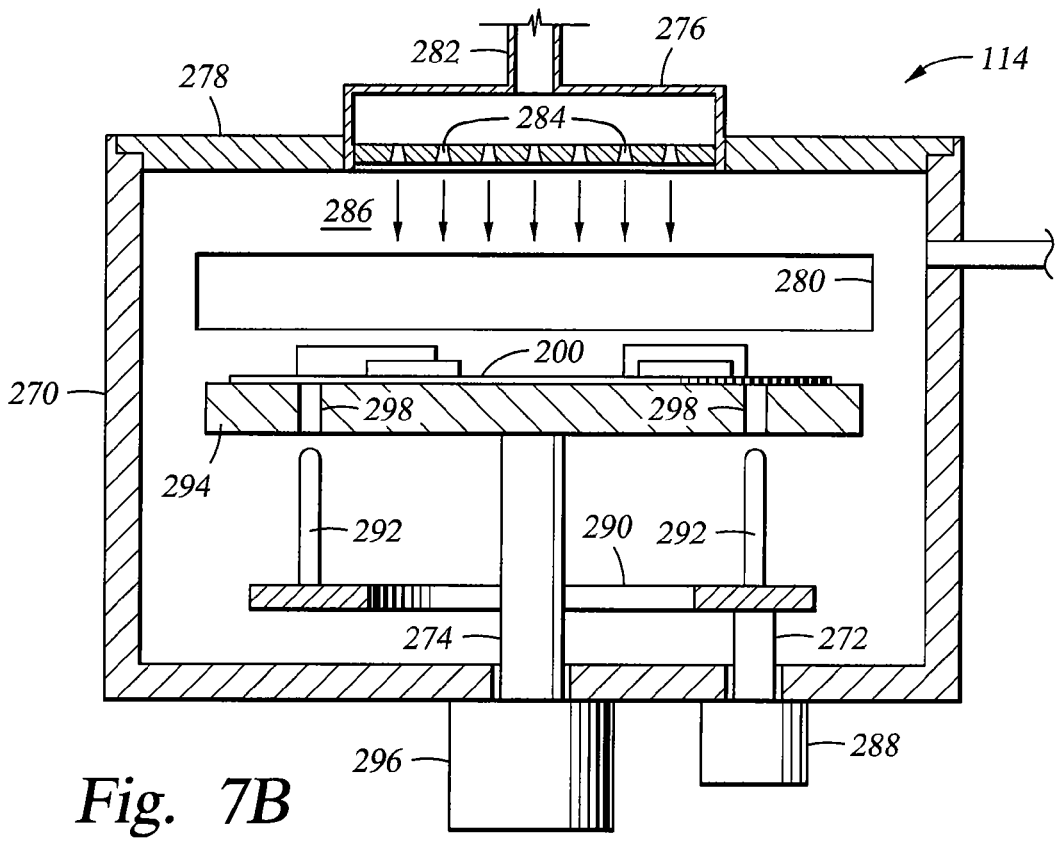
FIG. 7b is a side view of the sensor device in the process chamber in a second configuration.

The substrate support structure 274 generally includes a chuck 294 for supporting a substrate and mounted on a lift rod 296 for raising and lowering the substrate support structure 274. The substrate support structure 274 also has guide holes 298 for permitting the lift pins 292 to extend therethrough, as shown in FIG. 7a, to engage the substrate or sensor device 200. To place the sensor device 200 onto the chuck 294, the substrate lift mechanism 272 may lower the sensor device 200 to the chuck 294, as shown in FIG. 7b, or the chuck 294 may raise up to lift the sensor device 200. In this manner, the sensor device 200 is passed from the substrate lift mechanism 272 to the substrate support structure 274.

While seated on either the substrate lift mechanism 272 or the substrate support structure 274, the sensor device 200 can determine its inclination, just as it could when it was seated on the substrate handler 116. Both the substrate lift mechanism 272 and the substrate support structure 274 can be individually adjusted from outside the process chamber 114 by manipulating the mechanisms (not shown) that support and operate the lift rods 288, 296 to tilt or swivel the lift rods 288, 296, and thereby, change the inclination of the lift pins 292 or chuck 294, respectively. Since these manipulations can be done from outside, typically underneath, the process chamber 114, the sensor device 200 provides a means to receive feedback regarding the inclination of the substrate lift mechanism 272 and the substrate support structure 274 without opening the process chamber 114. Thus, these structures 272, 274 can be leveled to correct an improper inclination very quickly and accurately.

Additionally, the degree of misalignment between the substrate handler 116 and the substrate lift mechanism 272 and between the substrate lift mechanism 272 and the substrate support structure 274 can be determined from a reading of the inclination of the sensor device 200 before and after a transfer from one structure to the other. Thus, the sensor device 200 provides a way to convey the inclination at exchange points and to align each structure that supports a substrate with the other such structures without opening the system 100 and compromising the isolated environment therein. In a similar manner, even though it is not shown in the drawings, the indexer cassette lift of the load lock chambers 118 (FIG. 2) has a mechanism for leveling or aligning the indexer plate, which supports cassettes and/or substrates within the load lock chamber 118. The indexer can be aligned with respect to the substrate handlers 116, 128. A typical alignment procedure for aligning all of the substrate support structures within a system 100 may begin with leveling one support structure, such as whichever support structure is most difficult to adjust, e.g. the substrate handler 116, and then aligning all other support structures with respect to the first support structure. In this manner, alignment throughout the system 100 is assured, so a substrate is unlikely to be damaged during transfers from one support structure to another.

A typical operation of the sensor device 200 will be described with reference to the exemplary system described below.

An Exemplary System:

Referring back to FIG. 2, a processing system which may use the above described sensor device 200 to diagnose substrate handling conditions will now be described. FIG. 2a generally shows a perspective view of a processing system 100. FIG. 2b generally shows a schematic top view thereof. Although the function of the sensor device 200 is described herein with reference to the system 100, it is understood that the invention is not so limited, but that the sensor device 200 may function with any type of processing system. As mentioned briefly above, the processing system 100 includes a central transfer chamber 112 as the center of activity in the handling of wafers, or substrates, through the system 100. The transfer chamber 112 typically mounts on a platform 121. The transfer chamber 112 has process chambers 114 attached at facets 113. The process chambers 114 may be any type of process chamber, such as a physical vapor deposition chamber, a chemical vapor deposition chamber, an etch chamber, etc. It is not uncommon for a manufacturer of process chambers to provide over twenty different types of process chambers. The process chambers 114 may be supported by the transfer chamber 112, by the platform 121 or on their own platforms, depending on the configuration of the individual process chambers 114. Slit valves (not shown) in the facets 113 provide access and isolation between the transfer chamber 112 and the process chambers 114. Correspondingly, the process chambers 114 have openings (not shown) on their surfaces that align with the slit valves.

The system 100 includes a gas panel 124 connected to the process chambers 114 through fluid lines (not shown) for delivering process fluids to the process chambers 114 or a vaporizer (not shown). The gas panel 124 connects to a source of the process fluids in the manufacturing facility, and typically delivers the process fluids in a gaseous state to the process chambers 114.

The transfer chamber 112 also has two load lock chambers 118 mounted at facets 115. Openings (not shown) in the facets 115 provide access and isolation between the load lock chambers 118 and the transfer chamber 112. Correspondingly, the load lock chambers 118 have openings on their surfaces that align with the openings in facets 115. The load lock chambers 118 are optionally attached to mini-environment 120. The load lock chambers 118 and the mini-environment 120 have corresponding openings (not shown) providing access therebetween, while doors 126 for the openings provide isolation. The mini-environment 120 has four pod loaders 122 attached on its front side. Openings (not shown) with corresponding doors 123 provide access and isolation between the mini-environment 114 and the pod loaders 122. The pod loaders 122 are essentially shelves for supporting pods, or cassettes, 154 containing substrates 156 to be processed in the system 100.

In operation, the pods 154 containing substrates 156 to be processed in the system 100 are placed on the top of the pod loaders 122. However, when the system 100 is to be diagnosed with a sensor device 200, then a pod containing only the sensor device, with the switch 216 having been turned on, is placed on one of the pod loaders 122. Alternatively, if conditions within the system 100 permit, the sensor device 200 may be inserted in a pod containing production substrates, so the sensor device 200 will be transferred through the system 100 with almost no interruption to normal substrate processing. The mini-environment robot 128 removes the sensor device 200 out of the pod 154 and into one of the load lock chambers 118. During the entire time that the sensor device 200 is within the system 100, it is transmitting its data to a receiver for further transmission to a controller for storage or processing. Thus, the sensor device 200 begins by transmitting the condition of the pod 154 on the pod loader 122. When the robot 128 picks up the sensor device 200, the sensor device 200 can detect any misalignment between the pod 154 and the robot 128. Afterwards, the sensor device 200 transmits data diagnosing the movement of the robot 128 to the load lock chamber 118.

After the sensor device 200 has been loaded into the load lock chamber 118, the pressure in the load lock chamber 118 may be reduced to match that in the transfer chamber 112 and simulate actual processing conditions, or the transfer chamber 112 may be pressurized with a purge gas to bring the pressure level of the transfer chamber 112 to that of the load lock chamber 118. During this time, the sensor device 200 transmits data diagnosing the condition of the load lock chamber 118. After the load lock chamber 118 opens to the transfer chamber 112, the substrate handler 116 removes the sensor device 200 from the load lock chamber 118, and the sensor device 200 can detect any misalignment between the load lock chamber 118 and the substrate handler 116. If the sensor device 200 is to diagnose the entire system 100, then the substrate handler 116 moves the sensor device 200 through a representative sample of movements in the transfer chamber 112, such as in a complete circle as well as to each of the process chambers 114, while the sensor device 200 detects the conditions during movement, stopping and starting. When the substrate handler 116 moves the sensor device 200 to one of the process chambers 114, the substrate support structures, such as the lift pins 292 and chuck 294, receive the sensor device 200 and move the sensor device 200 through a typical set of movements to which a production substrate would be subjected. During this time, the sensor device 200 detects any misalignments between the substrate support structures as well as any irregular movements or improper inclinations. After the sensor device 200 is handled in the process chamber 114, the substrate handler 116 retrieves the sensor device 200 and moves the sensor device 200 back to one of the load lock chambers 118, preferably not the same load lock chamber 118 through which the sensor device 200 entered the system 100, so the other load lock chamber 118 may be diagnosed, too. Additionally, the substrate handler 116 may move the sensor device 200 to other types of chambers or devices, such as a substrate orienter or a cool down chamber. The load lock chamber 118 may transition the pressure to that of the mini-environment 120 or ambient environment, while the sensor device 200 transmits data regarding conditions in the load lock chamber 118. Afterwards, the substrate handler 128 retrieves the sensor device 200 and moves the sensor device 200 back to a wafer pod 154.

If the controller processes the data from the sensor device 200 while the sensor device 200 is moving through the system 100, then misalignments, improper inclinations or other irregularities may be determined almost immediately and corrective action may be taken by the operator. For example, if a misalignment is detected between the substrate handler 116 and the lift pins 292 of one of the process chambers 114, then the operator can adjust the substrate lift mechanism 272 to correct the misalignment. The operator can also cause the substrate lift mechanism 272 and substrate handler 116 to transfer the sensor device 200 back and forth while the operator makes fine adjustments to the substrate lift mechanism 272. This entire diagnosis and adjustment procedure may be conducted at any time and without opening the system 100 to the external environment.

While the foregoing is directed to the preferred embodiment of the present invention, other and further embodiments of the invention may be devised without departing from the basic scope thereof, and the scope thereof is determined by the claims which follow.

What is claimed is:

1. An apparatus for obtaining information from within a processing system, the apparatus comprising:
 a battery powered sensing device sized for transfer between a central transfer chamber and a vacuum processing chamber of the processing system by a substrate transfer robot, wherein the device is configured for obtaining information of a condition within the processing system.

2. The apparatus of claim 1, wherein the device is sized to pass through a slit valve separating the central transfer chamber and the processing chamber.

3. The apparatus of claim 1, wherein the information provided by the device is indicative of the position of the sensing device within the processing system.

4. The apparatus of claim 1, wherein the sensing device is configured to provide optical information.

5. The apparatus of claim 1, wherein the sensing device is configured to provide inclination information.

6. The apparatus of claim 1, wherein the sensing device is configured to provide acceleration information.

7. The apparatus of claim 1, wherein the sensing device is configured to provide temperature information.

8. The apparatus of claim 1 further comprising:
 a substrate-sized support platform having the sensing device coupled thereto.

9. The apparatus of claim 8 further comprising:
 a rechargeable battery coupled to the support platform and to the sensing device.

10. An apparatus for obtaining information from within a processing system, the apparatus comprising:
 a support platform adapted for transfer between a substrate transfer robot and a substrate support structure in a vacuum processing chamber of the processing system;
 a sensing device coupled to the support platform; and
 a battery coupled to the support platform and to the sensing device.

11. The apparatus of claim 10, wherein the battery is rechargeable.

12. The apparatus of claim 10, wherein the support platform, sensing device and battery have a combined size configured to pass through a slit valve separating the central transfer chamber and the processing chamber.

13. The apparatus of claim 10, wherein the sensing device provides at least one of optical information, inclination information, robot operational information, distance information, electrostatic chuck performance information, magnetic information, acceleration information or temperature information.

14. A method of obtaining information from within a processing system, the method comprising:
 robotically moving a battery powered sensing device through a slit valve disposed between a central transfer chamber and a vacuum processing chamber of a processing system; and
 obtaining, via the sensing device, information of a condition within the processing system.

15. The method of claim 14 further comprising removing the device from the processing chamber.

16. The method of claim 14, wherein obtaining further comprises:
 obtaining information relating to temperature within the processing system.

17. The method of claim 14, wherein obtaining further comprises:
 obtaining information relating to motion of the support platform within processing system.

18. The method of claim 14 further comprising:
 transferring the information to a controller disposed outside the processing system.

19. The method of claim 14, wherein obtaining further comprises:
 obtaining information relating to at least one of optical information, inclination information, robot operational information, distance information, electrostatic chuck performance information, magnetic information, acceleration information or temperature information.

20. The method of claim 14 further comprising
 recharging the battery.

21. The method of claim 14, further comprising processing a substrate in the processing system based on the information.

22. The method of claim 21, wherein processing the substrate comprises at least one of physical vapor deposition (PVD), chemical vapor deposition (CVD), and etching.

* * * * *

UNITED STATES PATENT AND TRADEMARK OFFICE
CERTIFICATE OF CORRECTION

PATENT NO.         : 7,434,485 B2                                    Page 1 of 1
APPLICATION NO.    : 11/427376
DATED              : October 14, 2008
INVENTOR(S)        : Hunter It is certified that error appears in the above-identified patent and that said Letters Patent is hereby corrected as shown below:

In the References Cited (56):

Please delete "6,198,176 B1 3/2001 Gillette" and insert --6,198,976 B1 3/2001 Sundar et al.-- therefor;

Please delete "6,871,660 B2 12/2003 Freed" and insert --6,671,660 B2 12/2003 Freed-- therefor;

Please delete "2005/0028049 A1 2/2005 Poolia et al." and insert --2005/0028049 A1 2/2005 Poolla et al.-- therefor.

Signed and Sealed this

Seventeenth Day of February, 2009

JOHN DOLL
*Acting Director of the United States Patent and Trademark Office*